(12) United States Patent
Ishizaka et al.

(10) Patent No.: US 7,491,430 B2
(45) Date of Patent: Feb. 17, 2009

(54) DEPOSITION METHOD FOR FORMING A FILM INCLUDING METAL, NITROGEN AND CARBON

(75) Inventors: Tadahiro Ishizaka, Albany, NY (US); Atsushi Gomi, Albany, NY (US); Tatsuo Hatano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 609 days.

(21) Appl. No.: 11/180,597

(22) Filed: Jul. 14, 2005

(65) Prior Publication Data

US 2006/0029748 A1  Feb. 9, 2006

(30) Foreign Application Priority Data

Aug. 3, 2004  (JP)  ............................... 2004-226953

(51) Int. Cl.
*H05H 1/24* (2006.01)

(52) U.S. Cl. ...................................... 427/569; 427/576
(58) Field of Classification Search ................ 427/118, 427/569
See application file for complete search history.

(56) References Cited

U.S. PATENT DOCUMENTS

| 5,306,666 | A | 4/1994 | Izumi | |
|---|---|---|---|---|
| 5,916,365 | A | 6/1999 | Sherman | |
| 6,416,822 | B1 | 7/2002 | Chiang et al. | |
| 6,630,201 | B2 * | 10/2003 | Chiang et al. | ............ 427/255.28 |
| 7,022,605 | B2 * | 4/2006 | Doan et al. | ............ 438/680 |
| 7,314,835 | B2 * | 1/2008 | Ishizaka et al. | ............ 438/758 |
| 7,338,901 | B2 * | 3/2008 | Ishizaka | ............ 438/680 |
| 2002/0076507 | A1 * | 6/2002 | Chiang et al. | ............ 427/569 |
| 2002/0090467 | A1 * | 7/2002 | Ramiah et al. | ............ 427/569 |
| 2002/0106846 | A1 | 8/2002 | Seutter et al. | |
| 2002/0197402 | A1 * | 12/2002 | Chiang et al. | ........... 427/255.39 |
| 2003/0013320 | A1 * | 1/2003 | Kim et al. | ............ 438/778 |
| 2003/0017697 | A1 * | 1/2003 | Choi et al. | ............ 438/679 |
| 2004/0009307 | A1 * | 1/2004 | Koh et al. | ............ 427/569 |
| 2004/0011286 | A1 * | 1/2004 | Kwon | ............ 118/715 |
| 2004/0082199 | A1 * | 4/2004 | Cheung et al. | ............ 438/789 |
| 2004/0099215 | A1 * | 5/2004 | Danek et al. | ............ 118/723 E |
| 2006/0008595 | A1 * | 1/2006 | Ishizaka et al. | ............ 427/569 |

FOREIGN PATENT DOCUMENTS

WO  WO 2004/112114 A1  12/2004

* cited by examiner

*Primary Examiner*—Timothy H Meeks
*Assistant Examiner*—Joseph Miller, Jr.
(74) *Attorney, Agent, or Firm*—Oblon, Spivak, McClelland, Maier & Neustadt, P.C.

(57) ABSTRACT

A deposition method for forming a thin film on a processed substrate by supplying a first gas including a metal, nitrogen, and carbon and a second gas reducing the first gas into a process vessel where a substrate holding table for holding the processed substrate is provided inside thereof, the deposition method includes a first step supplying the first process gas into the process vessel, and a second step supplying the second process gas so that the second process gas is plasma-excited by a plasma-exciting part provided in the process vessel. A content of at least one of the metal, nitrogen, and carbon in the thin film is controlled by changing a radio frequency power applied to the plasma-exciting part.

13 Claims, 8 Drawing Sheets

(A)

(B)

(A)

(B)

(A)

(B)

(C)

(A)

(B)

(C)

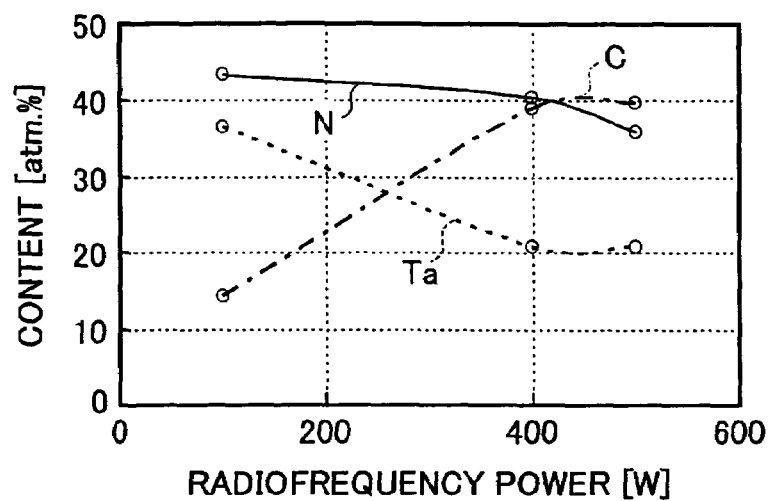
(A)
FIG.6
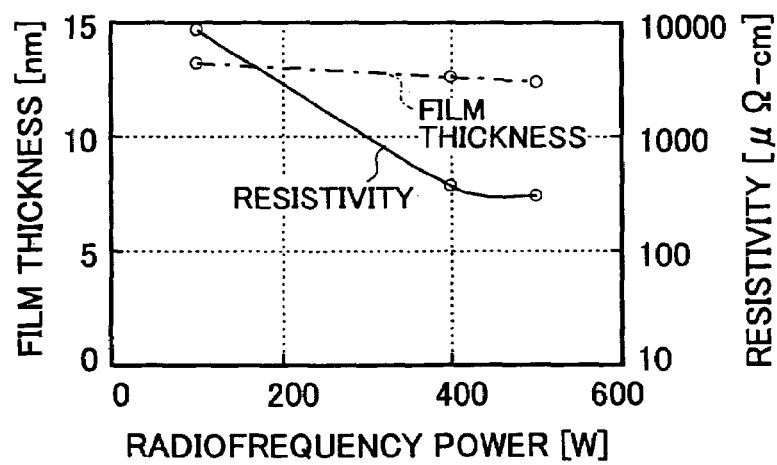
(B)

DEPOSITION METHOD FOR FORMING A FILM INCLUDING METAL, NITROGEN AND CARBON

BACKGROUND OF THE INVENTION

1. Field of the Invention

The present invention generally relates to a deposition method for forming a thin film on a processed substrate.

2. Description of the Related Art

Recently and continuing, as performance and function of semiconductor devices are becoming high, high integration of the semiconductor devices are being promoted and it is extremely desired that the semiconductor devices have fine structures. A technology for a wiring rule equal to or less than 0.10 μm has been developing. It is required for a thin film used for forming such a semiconductor device having high performance to have little impurity in the film and a high film quality such as a crystal orientation. Furthermore, it is desirable that the thin film have good coverage for forming on a minute pattern.

As a deposition method satisfying the above-discussed demand, an Atomic Layer Deposition method (ALD method) has been suggested. In this method, plural kinds of processing gas are mutually supplied one kind by one kind at the time of deposition, so that a deposition in a level close to an atomic layer or a molecular layer is implemented via adsorption of the process gas on a reaction surface. A thin film having a designated thickness can be obtained by repeating the above-mentioned steps.

The following steps are taken for implementing the deposition by the ALD method, for example. A process vessel having a first gas supply path for supplying first gas and a second gas supply path for supplying second gas, where a processed substrate is held inside thereof, is prepared. The first gas and the second gas are mutually supplied to the process vessel. More specifically, first, the first gas is supplied on the substrate in the process vessel so that an adsorption layer is formed on the substrate. Then, the second gas is supplied on the substrate in the process vessel so as to be reacted. This process is repeated a designated numbers of times as necessary. According to this method, since reaction with the second gas is done after the first gas is adsorbed on the substrate, it is possible to make a deposition temperature low. In addition, it is possible to obtain a high quality film having little impurity. Furthermore, it is possible to avoid forming a void due to reaction and consumption of the process gas at a hole in the upper part that is a problem in the conventional CVD method for depositing on the minute pattern, and therefore it is possible to obtain a good coverage property.

A film made of a first gas including a metal and a film made by using reduction gas of the first gas as a second gas so as to include the metal can be formed as a film formed by such a deposition method. For example, a film made of Ta, TaN, Ta(C)N, Ti, TiN, Ti(C)N, W, WN, W(C)N, or the like can be formed.

For example, a Ta(C)N film can be formed by using a chemical compound including Ta, such as Ta(NC(CH$_3$)$_2$ C$_2$H$_5$)(N(CH$_3$)$_2$)$_3$, as the first process gas and H$_2$ as the second gas, and plasma-exciting H$_2$ so that Ta(NC(CH$_3$)$_2$ C$_2$H$_5$)(N(CH$_3$)$_2$)$_3$ is reduced.

The film formed by such a deposition method is a high quality film and a good coverage property. Hence, for example, the film may be used as a Cu diffusion barrier film formed between an insulation film and Cu in a case where a Cu wiring is formed in the semiconductor device. See U.S. Pat. Nos. 5,916,365, 5,306,666 and 6,416,822, and U.S. Patent Application Publication No. 2002/0106846.

In a case where the thin film is formed by using the ALD method whereby the gasses are mutually supplied as discussed above, there is a problem in that it is difficult to optionally change a property of the formed thin film while the deposition whose film quality is good and having stable reproducibility can be done.

For example, it is difficult to change the composition of the formed film. For example, it is difficult to optionally change the content of C or N in the Ta(C)N film.

SUMMARY OF THE INVENTION

Accordingly, it is a general object of the present invention to provide a novel and useful deposition method.

Another object of the present invention is to provide a deposition method for forming a thin film by mutually supplying a first gas including a metal, nitrogen, and carbon and a second gas reducing the first gas so that the thin film is formed, by which method the content of at least one of the metal, nitrogen, and carbon in the thin film can be controlled.

The above objects of the present invention are achieved by a deposition method for forming a thin film on a processed substrate by supplying a first gas including a metal, nitrogen, and carbon and a second gas reducing the first gas into a process vessel where a substrate holding table for holding the processed substrate is provided inside thereof, the deposition method including:

a first step supplying the first process gas into the process vessel; and a second step supplying the second process gas so that the second process gas is plasma-excited by a plasma-exciting part provided in the process vessel;

wherein a content of at least one of the metal, nitrogen, and carbon in the thin film is controlled by changing a radio frequency power applied to the plasma-exciting part.

Other objects, features, and advantages of the present invention will become more apparent from the following detailed description when read in conjunction with the accompanying drawings.

BRIEF DESCRIPTION OF THE DRAWINGS

FIG. 6-(A) is a chart showing a result of examination of content of Ta, C, and N included in a thin film formed by the deposition method of the first example by using a Rutherford Backscattering Spectroscopy method (RBS analysis), and FIG. 6-(B) is a chart showing a result of examination of film thickness and resistivity of the thin film shown in FIG. 6-(A);

DETAILED DESCRIPTION OF THE PREFERRED EMBODIMENTS

A description will now be given, with reference to FIG. 1 through FIG. 8, of embodiments of the present invention.

Figure 1:
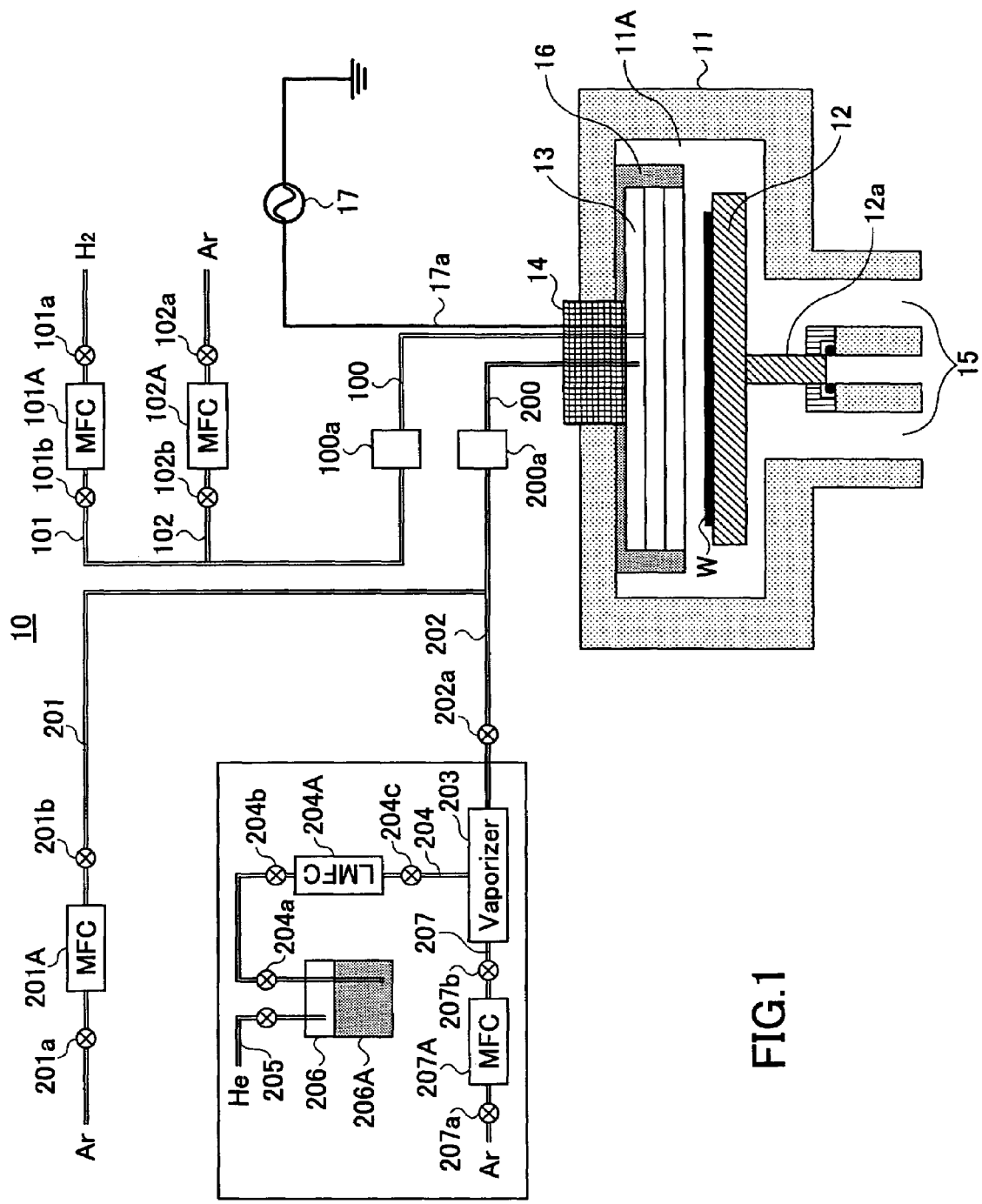
FIG. 1 is a schematic view showing an example of a deposition apparatus whereby a deposition method of a first example of the present invention can be implemented.

FIG. 1 is a schematic view showing an example of a deposition apparatus whereby a deposition method of a first example of the present invention can be implemented.

A deposition apparatus 10 shown in FIG. 1 includes a process vessel 11. A processed substrate W is received inside of the process vessel 11. First gas and second gas are supplied into a process space 11A formed in the process vessel 11 via gas lines 200 and 100, respectively.

The plural kinds of processing gas are mutually supplied, one kind by one kind, to the process space 11A via the gas line 200 or 100, so that a deposition in a level close to an atomic layer or a molecular layer is implemented via an adsorption of the process gas on a reaction surface. By repeating the process, according to the ALD method, a thin film having a designated thickness can be formed on the processed substrate W. While a deposition temperature of the film formed by such an ALD method is low, the film formed by the ALD method has little impurity, high quality, and a good coverage property for being deposited on a minute pattern.

In the conventional ALD method whereby the plural kinds of gas are mutually supplied for deposition, although it is possible to obtain a high quality reproducible film and implement the deposition stably, it is difficult to control a quality such as the composition of the thin film.

According to the deposition method of the embodiment of the present invention, the above-mentioned problem is solved so that content of at least one of the metal, nitrogen, and carbon in the formed thin film can be controlled.

According to the deposition method of this embodiment, the first process gas including the metal, nitrogen, and carbon and the second gas reducing the first process gas are used. For the purpose of promoting reaction when the first process gas is reduced by the second process gas, the second process gas is plasma-excited. When the second process gas is plasma-excited, a radio frequency (RF) power level is changed so that the content of the metal, nitrogen, and carbon in the formed thin film can be controlled.

The deposition apparatus 10 shown in FIG. 1 includes the process vessel 11 made of, for example, aluminum, aluminum whose surface is anodic-oxidized, or stainless steel. A substrate holding table 12 made of, for example, Hastelloy, and having a substantially circular plate-shaped configuration is provided inside of the process vessel 11. The substrate holding table 12 is supported by a substrate holding table support part 12a. A semiconductor processed substrate W as the processed substrate is provided in the center of the substrate holding table 12. A heater (not shown in FIG. 1) is installed in the substrate holding table 12 so that the processed substrate is heated so as to have a desirable temperature.

The process space 11A inside of the substrate process vessel 11 is vacuum-exhausted by exhausting means (not shown in FIG. 1) connected to a exhaust port 15 so that the process space 11A can be in a decompression state. In addition, the processed substrate W is taken in or taken out from the process vessel 11 by a gate valve (not shown in FIG. 1) provided in the process vessel 11.

A shower head part 13, made of, for example, aluminum and having a substantially cylinder-shaped configuration, is provided in the process vessel 11 so as to face the substrate holding table 12. An insulator 16 is provided on a side wall surface of the shower head part 13 and between the shower head part 13 and the process vessel 11. The insulator 16 is made of, for example, crystal or ceramic such as SiN or AlN.

An insulator 14 made of insulation material pierces an opening part provided on a wall surface situated at a upper part of the process vessel 11 and above the shower head part 13. A conductor line 17a connected to the radio frequency power source 17 pierces the insulator 14. The conductor line 17a is connected to the shower head part 13. The RE power is applied to the shower head part 13 by the conductor line 17a.

The gas line 200 for supplying the first process gas to the process vessel 11A and the gas line 100 for supplying the second process gas to the process vessel 11A are connected to the shower head part 13. The first and second process gases are supplied to the process space 11A via the shower head part 13. Insulators 200a and 100a are inserted into the gas lines 200 and 100, respectively. The gas lines 200 and 100 are isolated from the RF power.

Figure 2:
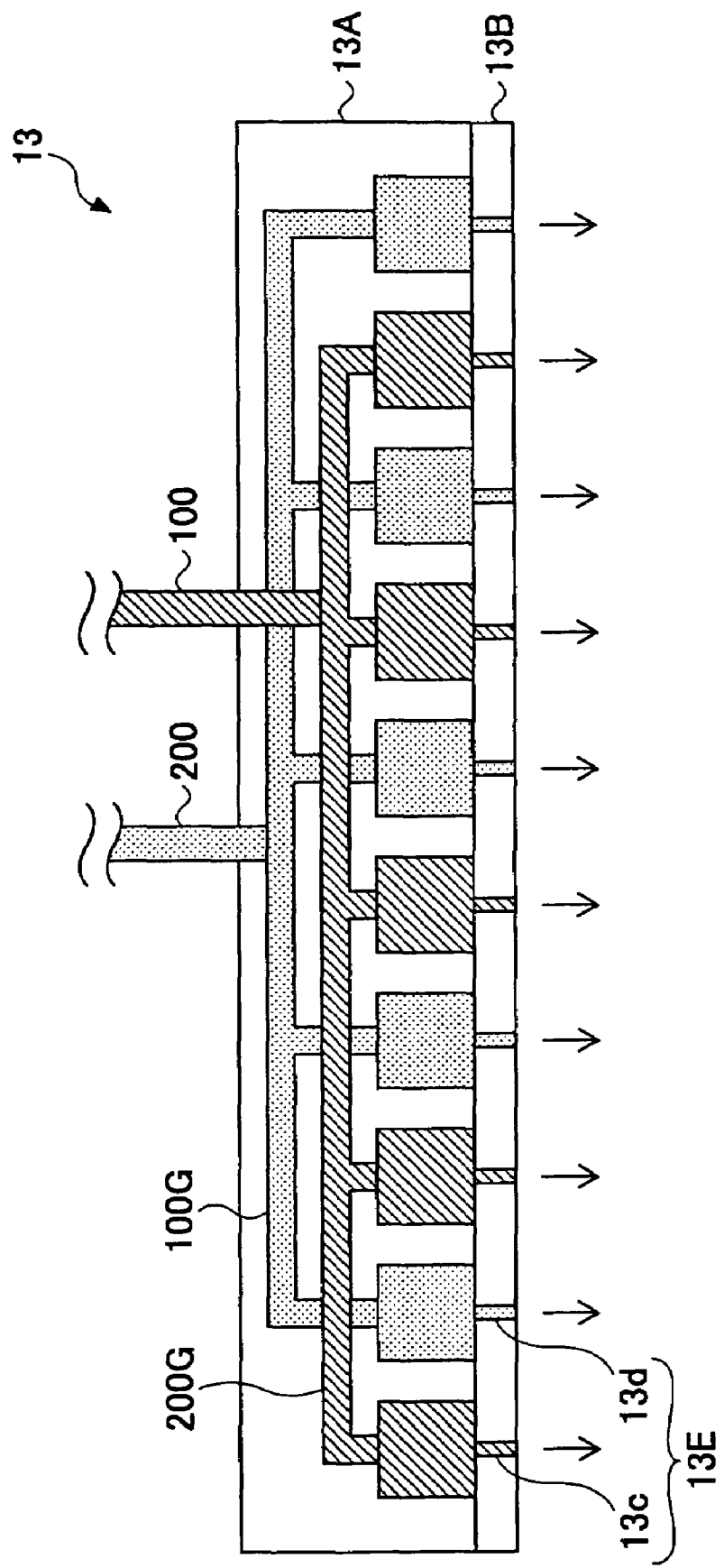
FIG. 2 is a cross-sectional view schematically showing a shower head part used for the deposition apparatus shown in FIG. 1.

FIG. 2 is a cross-sectional view schematically showing the shower head part 13 shown in FIG. 1. In FIG. 2, parts that are the same as the parts shown in FIG. 1 are given the same reference numerals, and explanation thereof is omitted. The shower part 13 includes a shower head main body 13A and a shower plate 13B. A gas flow channel 200G for the first process gas and a gas flow channel 100G for the second process gas are formed inside of the shower head main body 13A. A gas hole 13E is formed in the shower plate 13B, which plate engages the shower head main body 13A. The gas hole 13E includes plural gas holes 13c and 13d.

The gas flow channel 200G connected to the gas line 200 is further connected to the gas hole 13c of the shower plate 13B. That is, the first process gas is supplied to the process space 11A via a first gas supply path formed from the gas line 200 to the gas hole 13c through the gas flow channel 200G. The gas flow channel 100G connected to the gas line 100 is further connected to the gas hole 13d of the shower plate 13B. That is, the second process gas is supplied to the process space 11A via a second gas supply path formed from the gas line 100 to the gas hole 13d through the gas flow channel 100G.

Thus, in the shower head part 13, the gas flow channels for the first and second process gases are formed to be independent of each other. The first and second process gases are mixed in the process space 11A. In other words, the shower head part 13 has a so-called post-mix type shower head structure.

A gas line 202 and a gas line 201 are connected to the gas line 200. The first process gas is supplied to the gas line 200 by the gas line 202 having a valve 202a. Purge gas is supplied to the gas line 200 by the gas line 201.

Similarly, a gas line 101 and a gas line 102 are connected to the gas line 100. The second process gas is supplied to the gas line 100 by the gas line 101. Purge gas is supplied to the gas line 100 by the gas line 102.

A vaporizer 203 is connected to the gas line 202 via the valve 202a. The vaporizer 203 vaporizes a liquid material. More specifically, the vaporizer 203 vaporizes a liquid material supplied from the line 204 so as to make the first process gas. The first process gas is supplied from the gas line 202 to the gas line 200 together with carrier gas supplied from the line 206 such as Ar.

The line 204 for supplying the liquid material to the vaporizer 203 is connected to a material vessel 206. The vaporizer 204 has a mass flow rate controller 204A for liquid and valves 204a through 204c. A material 206A is held in the material vessel 206. More specifically, a material of an amide chemical compound, for example, a material including a metal, nitrogen, and carbon, such as $Ta(NC(CH_3)_2C_2H_5)(N(CH_3)_2)_3$. The material is pressurized by gas supplied from the gas line 205 such as He so as to be supplied to the vaporizer 203.

A supply source of the purge gas such as Ar gas is connected to the gas line 201 for supplying the purge gas to the gas line 200. A mass flow rate controller 201A and valves 201a and 201b are provided to the gas line 201. Under this structure, the flow rate of the supplied purge gas is controlled.

A supply source of the second process gas such as $H_2$ gas is connected to the gas line 101 connected to the gas line 100. A mass flow rate controller 101A and valves 101a and 101b are provided to the gas line 101. Under this structure, the flow rate of the second process gas supplied to the gas line 100 is controlled.

A supply source of the purge gas such as Ar gas is connected to the gas line 102 for supplying the purge gas to the gas line 100. A mass flow rate controller 102A and valves 102a and 102b are provided to the gas line 102. Under this structure, the flow rate of the supplied purge gas is controlled.

The deposition apparatus 10 is controlled as follows in a case where a film including the metal, nitrogen, and carbon is formed on the processed substrate W provided on the substrate holding table 12 by the deposition apparatus 10, for example.

First, the first process gas including the metal is supplied to the process space 11A via the gas line 200 and the shower head part 13. After the first process gas is adsorbed on the processed substrate, the first process gas remaining in the process space 11A is exhausted by the exhaust port 15. In this case, the process space 11A is purged by using the purge gas.

Next, the second process gas reducing the first process gas is supplied to the process space 11A via the gas line 100 and the shower head part 13. Furthermore, the RF power is applied to the shower head part 13 from the radio frequency power source 17 so that plasma of the second process gas is excited in the process space 11A. Because of this, the dissociation of the second process gas is promoted so that the reduction of the first process gas is promoted by ions or radical generated due to the dissociation.

Next, the second process gas remaining in the process space 11A is exhausted by the exhaust port 15. In this case, the process space 11A is purged by using the purge gas.

By repeating the above-discussed processes, that is, by repeating that first process gas is supplied to the process space 11A and then exhausted and the second process gas is supplied to the process space 11A and then exhausted designated times, the thin film having a desirable thickness can be formed on the processed substrate W.

The film formed by the above-discussed ALD method has little impurities and a high film quality.

In the conventional art, when the thin film is formed by the ALD deposition method, it may be difficult to control a property, such as composition, of the thin film. Hence, in this embodiment, the RF power in the case where the second process gas is plasma-excited is changed so that the composition of the formed thin film such as the content of at least one of the metal, nitrogen, and carbon can be controlled.

The reason why the composition of the formed thin film can be controlled by changing the RF power in the case where the second process gas is plasma-excited is discussed below with reference to FIG. 3 through FIG. 5.

Figure 3:
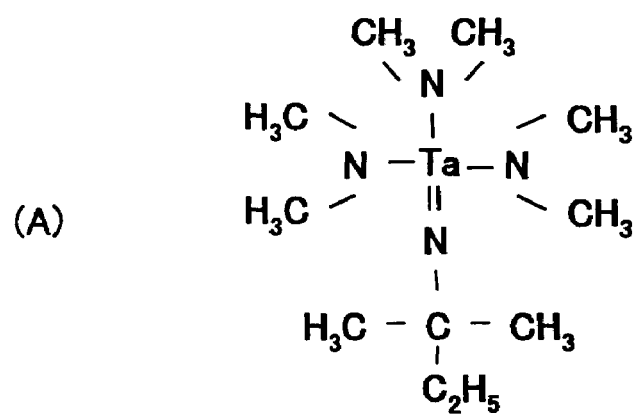
FIG. 3-(A) is a schematic view showing a structure of Ta(NC(CH$_3$)$_2$C$_2$H$_5$)(N(CH$_3$)$_2$)$_3$, and FIG. 3-(B) is a schematic view showing a state where Ta(NC(CH$_3$)$_2$C$_2$H$_5$)(N (CH$_3$)$_2$)$_3$ is adsorbed on a processed substrate.
Figure 3:
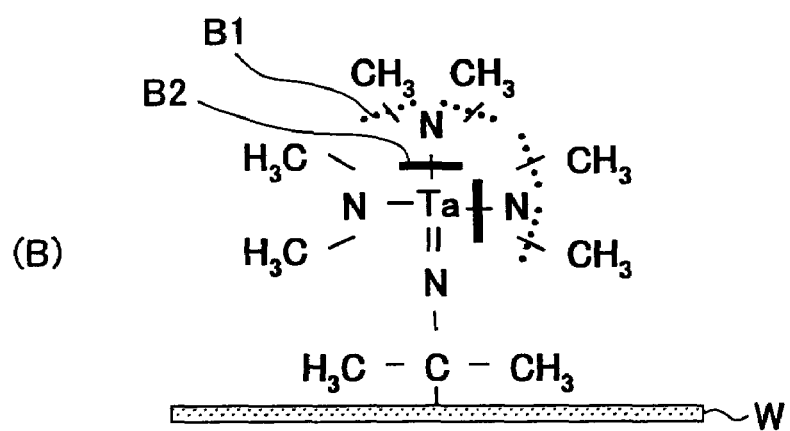

FIG. 3-(A) is a schematic view showing a structure of $Ta(NC(CH_3)_2C_2H_5)(N(CH_3)_2)_3$. FIG. 3-(B) is a schematic view showing a state where $Ta(NC(CH_3)_2C_2H_5)(N(CH_3)_2)_3$ is adsorbed on a processed substrate.

Referring to FIG. 3-(A), $Ta(NC(CH_3)_2C_2H_5)(N(CH_3)_2)_3$ has a structure where N is bonded to Ta, carbon and a methyl group are bonded, and the methyl group and an ethyl group are bonded to the carbon.

FIG. 3-(B) shows a state where $Ta(NC(CH_3)_2C_2H_5)(N(CH_3)_2)_3$ supplied on the heated processed substrate W is adsorbed on the processed substrate W. In the structure of $Ta(NC(CH_3)_2C_2H_5)(N(CH_3)_2)_3$, a bonding of $C-C_2H_5$ whose bonding force is weak is cut and therefore a bonding arm of C may be bonded to the processed substrate or the formed article or the adhesion on the processed substrate. That is, FIG. 3-(B) schematically shows a state of the processed substrate after the first process gas is supplied.

Next, in this state, the second process gas such as $H_2$ is supplied so that the second process gas is plasma-excited. A reaction wherein a bonding arm of $Ta(NC(CH_3)_2C_2H_5)(N(CH_3)_2)_3$ adsorbed on the substrate is cut by hydrogen radical or a hydrogen ion is generated.

In this case, the bonding whose bonding energy is small, that is, a bonding that may be easily cut by the plasma-excited second process gas, is $N-CH_3$ bonding shown by bonding B1 in FIG. 3-(B). That is, in a case where the RF power when the second process gas is plasma-excited is low, cutting of the bonding B1 may be given priority to.

In a case where the RF power when the second process gas is plasma-excited is high, a bonding having higher bonding energy is cut. Hence, for example, Ta—N bonding shown by bonding B2 in FIG. 3-(B) may be further cut. Thus, in this example, by controlling the RF power applied to the shower head part 13, the bonding state of the first process gas adsorbed on the processed substrate can be optionally changed. Therefore, it is possible to change the composition of the formed thin film.

Figure 4:
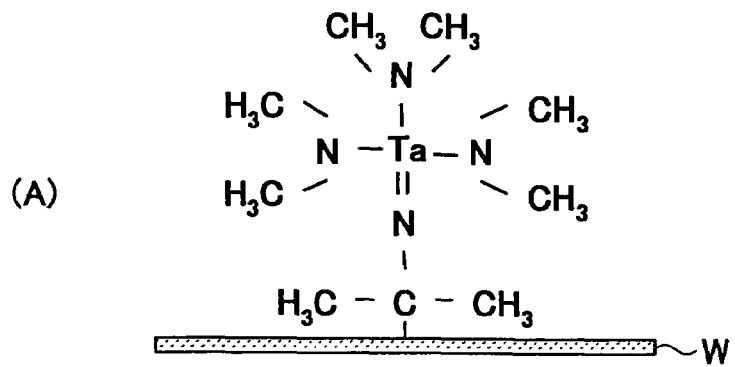
FIG. 4 is a first schematic view showing a step for forming a Ta(C)N film by the deposition method of the first example of the present invention.
Figure 4:
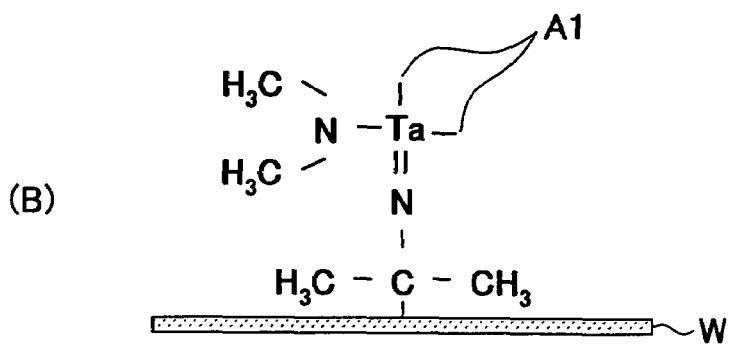
Figure 4:
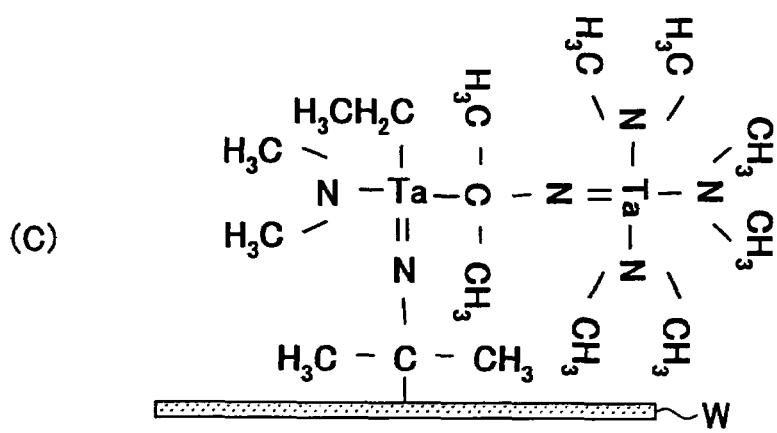

Next, in the deposition method of this example, a model of a thin film (Ta(C)N film) that may be formed in a case where the RF power is high is schematically shown in FIG. 4-(A) through FIG. 4-(C). A model of a thin film (Ta(C)N film) that may be formed in a case where the RF power is low is schematically shown in FIG. 5-(A) through FIG. 5-(C).

More specifically, FIG. 4-(A) through FIG. 4-(C) show processes whereby the Ta(C)N film is formed by the deposition method of the present invention in a case where the RF power is high.

A state shown in FIG. 4-(A) is after $Ta(NC(CH_3)_2C_2H_5)(N(CH_3)_2)_3$ that is the first process gas is supplied on the processed substrate, namely a state where $Ta(NC(CH_3)_2C_2H_5)(N(CH_3)_2)_3$ is adsorbed on the processed substrate W.

Next, in a state shown in FIG. 4-(B), the second process gas such as $H_2$ is supplied on the processed substrate, the plasma-exciting is implemented, and a hydrogen radical or a hydrogen ion is generated. The bonding is cut by the hydrogen radical or the hydrogen ion. A non-bonding arm for bonding $Ta(NC(CH_3)_2C_2H_5)(N(CH_3)_2)_3$ supplied next is formed.

In this case, since the plasma energy, namely the RF power, is high, the bonding B2, namely Ta—N bonding is cut so that a non-bonding arm A1 is cut. Next, when the first process gas such as $Ta(NC(CH_3)_2C_2H_5)(N(CH_3)_2)_3$ is supplied on the processed substrate W again, bonding occurs to the non-bonding arm A1.

In this case, since the Ta—N bonding is cut, the content of N in the formed thin film is small as compared with a case where the RF power is low. In addition, in this case, the content of C in the thin film is larger and the content of Ta in the thin film is lower as compared with the case where the RF power is low. That is, the content of C in the formed thin film is increased and the contents of N and Ta in the formed thin film are decreased, by making the RF power higher.

Figure 5:
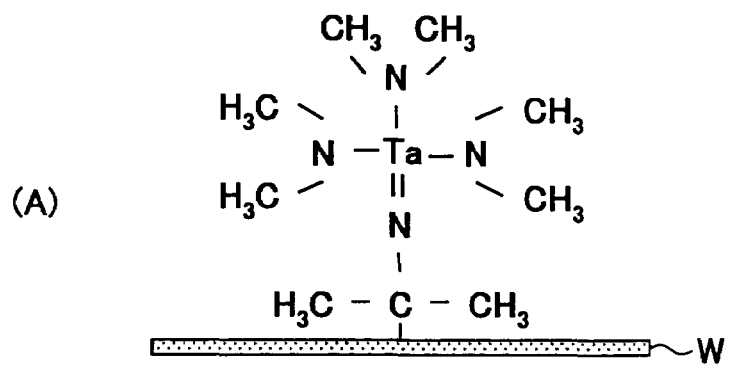
FIG. 5 is a second schematic view showing the step for forming the Ta(C)N film by the deposition method of the first example of the present invention.
Figure 5:
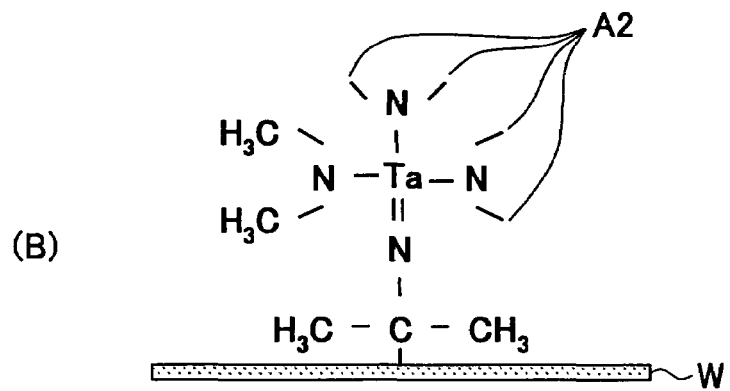
Figure 5:
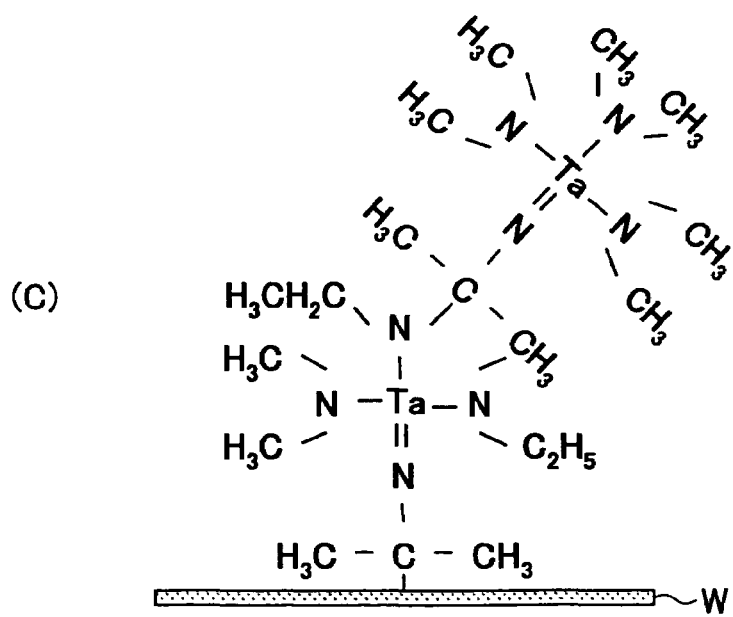

FIG. 5-(A) through FIG. 5-(C) show processes whereby the Ta(C)N film is formed by the deposition method of the present invention in a case where the RF power is low.

A state shown in FIG. 5-(A) is the same as the state shown in FIG. 4-(A).

Next, in a state shown in FIG. 5-(B), the second process gas such as $H_2$ is supplied on the processed substrate, the plasma-exciting is implemented, and a hydrogen radical or a hydrogen ion is generated. The bonding is cut by the hydrogen radical or the hydrogen ion. A non-bonding arm for bonding $Ta(NC(CH_3)_2C_2H_5)(N(CH_3)_2)_3$ supplied next is formed.

In this case, since the plasma energy, namely the RF power is low, the bonding B1 whose bonding energy is small, namely N—$CH_3$ bonding is cut so that a non-bonding arm A2 is formed. Next, when the first process gas such as $Ta(NC(CH_3)_2C_2H_5)(N(CH_3)_2)_3$ is supplied on the processed substrate W again, bonding occurs to the non-bonding arm A2.

In this case, since the N—$CH_3$ bonding is cut, Ta—N bonding is kept and therefore the content of N in the formed thin film is large as compared with a case where the RF power is high.

In addition, in this case, the content of C in the thin film is smaller and the content of Ta in the thin film is higher as compared with the case where the RF power is high. That is, the content of C in the formed thin film is decreased and the contents of N and Ta in the formed thin film are increased, by making the RF power lower.

An analysis result of Ta(C)N film formed by changing the RF power applied to the shower head part 13 by using the deposition method of this embodiment is shown in FIG. 6-(A) and FIG. 6-(B).

More specifically, FIG. 6-(A) is a chart showing a result of examination of contents of Ta, C, and N included in the thin film formed in a state where $Ta(NC(CH_3)_2C_2H_5)(N(CH_3)_2)_3$ is supplied as the first process gas, $H_2$ is supplied as the second gas, and the RF power applied to the shower head part 13 for plasma-exciting the second process gas is changed, obtained by using a Rutherford Backscattering Spectroscopy method (RBS analysis).

Referring to FIG. 6-(A), as the RF power is increased, the content of C is increased and the contents of N and Ta are decreased. As the RF power is decreased, the content of C is decreased and the contents of N and Ta are increased. That is, it is realized that it is possible to optionally control the contents of metal such as Ta, N and C in the formed thin film by changing the RF power.

Furthermore, it is possible to control the resistivity of the thin film, for example, by changing the content of atoms included in the thin film.

FIG. 6-(B) is a chart showing the result of examination of film thickness and resistivity of the thin film shown in FIG. 6-(A).

Referring to FIG. 6-(B), the change of the film thickness is little and the film thickness is substantially constant, in a case where the RF power is changed. On the other hand, the resistivity of the thin film is reduced as the RF power is increased. This is because the change of the composition of the thin film shown in FIG. 6-(A) causes the change of the resistivity. Particularly, the increasing of the content of C may be a reason for decreasing of the resistivity. That is, it is possible to control a property of the formed thin film, the resistivity for example, by increasing the RF power. For example, it is realized that as the RF power is increased, the resistivity can be made small. In addition, it is preferable that a thin film having a small resistivity be used as a diffusion barrier film of Cu being a wiring of a semiconductor device.

In a case where this film is used as the diffusion barrier film of Cu, it is preferable that Cu have good wetting property. If the wetting of Cu is good, it is possible to form the Cu wiring having a good property and a good electro-migration resistance. Thus, in order to make Cu have good wetting property, it is preferable that the content of N in the diffusion barrier film of Cu be high. In the deposition method of this embodiment, the RF power is made low and the content of N in the diffusion barrier film of Cu is made high, it is possible to form the diffusion barrier film of Cu having good wetting property.

In the conventional art, it is difficult to form the Cu diffusion barrier film having good wetting of Cu and small resistivity. However, according to the deposition method of this embodiment, it is possible to form the Cu diffusion barrier film having good wetting of Cu and small resistivity. An example of a structure of the Cu diffusion barrier film is shown in FIG. 7.

Figure 7:
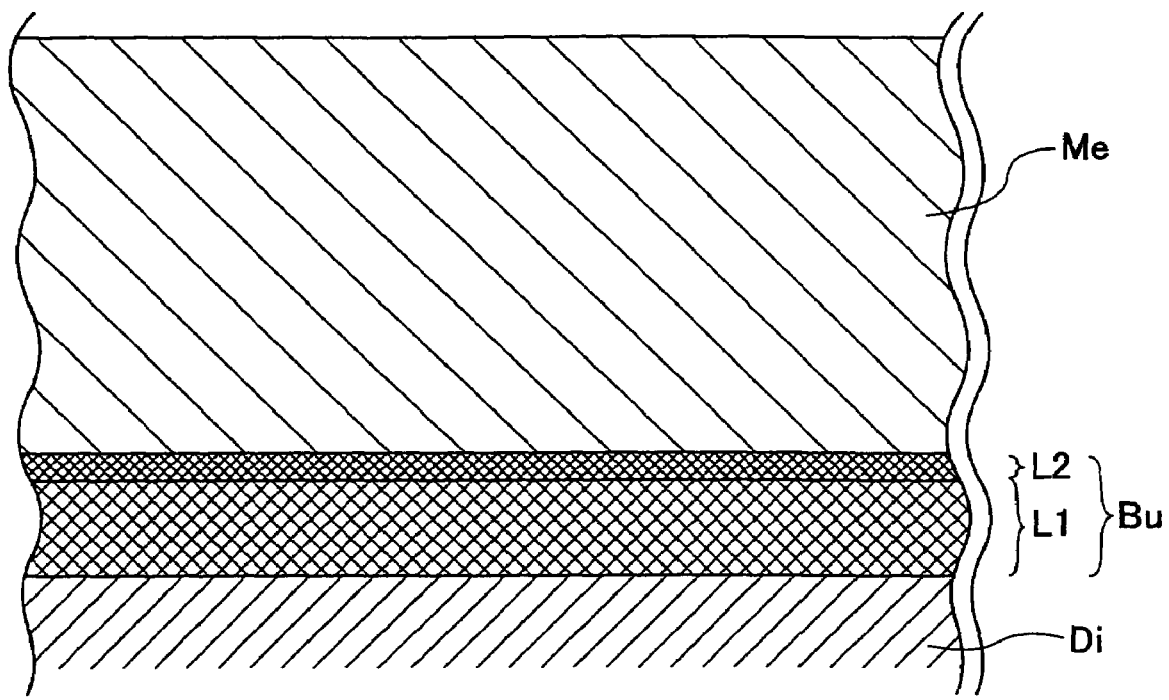
FIG. 7 is a cross-sectional view showing an example where the thin film formed by the deposition method of the first example is used as a Cu diffusion barrier film.

FIG. 7 schematically shows a part of the cross-section of the semiconductor device including the Cu wiring layer. Referring to FIG. 7, the semiconductor device shown in FIG. 7 includes Cu wiring layer Me and interlayer insulation layer Di. A Cu diffusion barrier film Bu including a first layer L1 and a second layer L2, formed by the deposition method of this embodiment, is formed between the Cu wiring layer Me and the interlayer insulation layer Di.

The second layer L2 is formed at a side contacting the Cu wiring layer Me. In a case where the second layer L2 is formed, the RF power is made high when the second process gas is dissociated and the content of N in the formed film is increased, so that the film having good wetting of Cu can be obtained.

In a case where the first layer L1 is formed, the RF power is made low when the second process gas is dissociated and the content of C in the formed film is increased, so that resistivity of the formed film can be made small. In this case, if the thickness of the first layer L1 is thick in the thicknesses of the Cu diffusion barrier film Bu, the resistivity of the Cu diffusion barrier film Bu is made small.

Thus, in the deposition method of this embodiment, the property of the thin film is optionally controlled and a film having a different property can be formed in a direction of the thickness of the formed film. Furthermore, in this case, it is possible to continuously change the property of the film such as the resistivity or wetting property by gradually making the RF power higher or lower in the direction of the film thickness in the deposition process, namely from the first half to the second half of the deposition. Thus, if a rate of change of the property of the film in the direction of the film thickness is slow, it is possible to prevent a crystal defect or a defect at an interface from being formed so that a good film quality can be obtained.

Next, an example of the deposition method of this example by using the deposition apparatus 10 shown in FIG. 1 is discussed with reference to FIG. 8.

Figure 8:
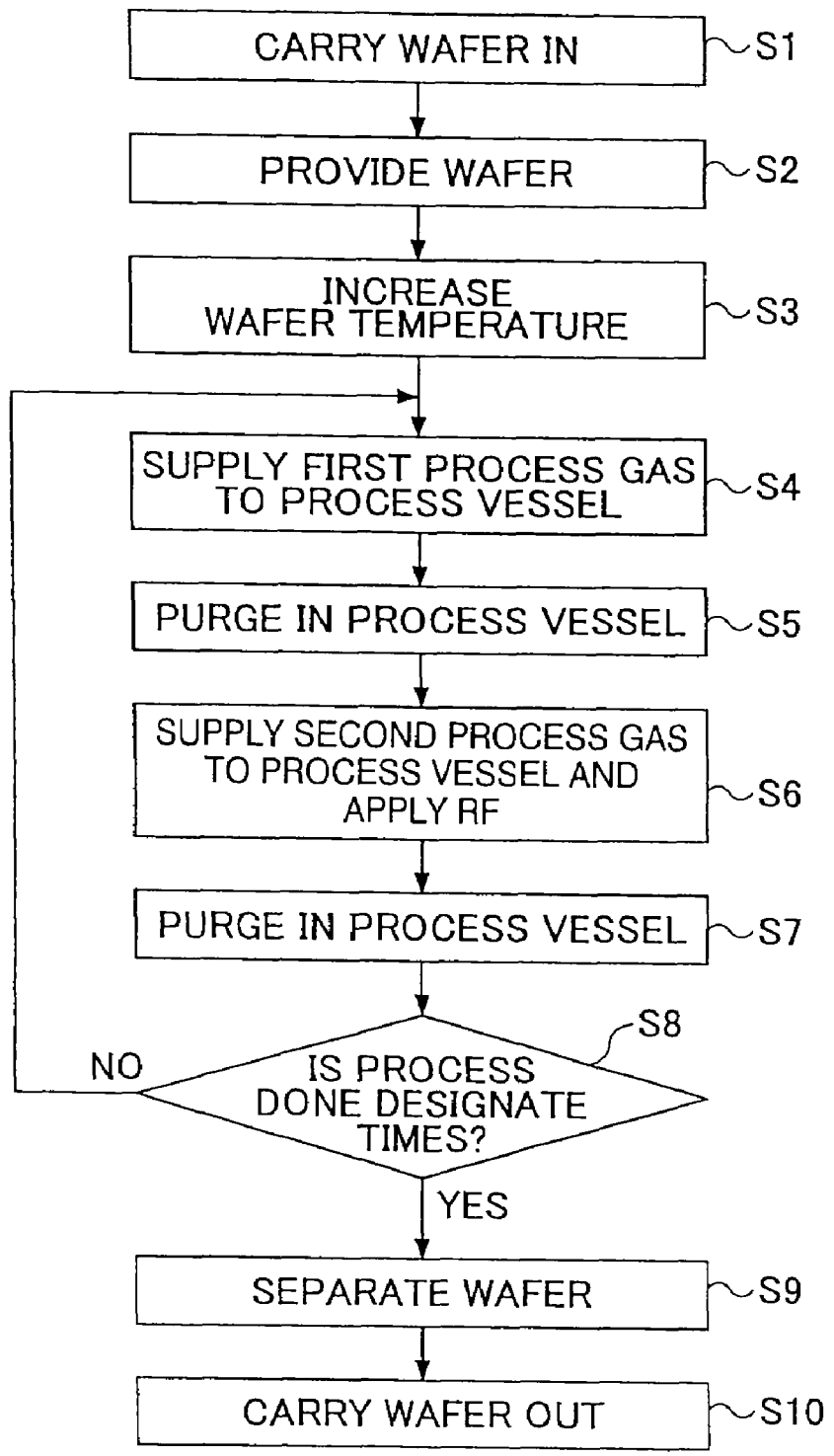
FIG. 8 is a flowchart showing an example of the deposition method of the first example of the present invention.

FIG. 8 is a flowchart showing an example of the deposition method of this embodiment of the present invention. In FIG. 8, parts that are the same as the parts discussed above are given the same reference numerals, and explanation thereof is omitted.

In step 1, the processed substrate W is carried into the deposition apparatus 10.

In step 2, the processed substrate W is provided on the substrate holding table 12.

In step 3, the temperature of the processed substrate W is increased by the heater installed in the holding stand 12.

In step 4, the valves 204a, 204b and 204c are opened so that the material 206A is supplied from the material vessel 206 to the vaporizer 203 via the line 204. The material 206A is made of liquid state $Ta(NC(CH_3)_2C_2H_5)(N(CH_3)_2)_3$. The flow amount of the material 206A is controlled by the mass flow rate controller 204A.

The material 206A is vaporized by the vaporizer 203 so as to be used as the first process gas. The first process gas is supplied with Ar supplied from the gas line 207 to the vaporizer 203, from the gas line 202 to the process space 11A via the gas line 200.

In this step, the first process gas is adsorbed on the processed substrate by supplying the first process gas on the processed substrate.

In this step, the valves 102a and 102b are opened and the flow amount is controlled by the mass flow rate controller 102A. Ar, as reverse flow prevention gas, is supplied from the gas line 100 to the process space 11A so that the first process gas is prevented from reverse-flowing from the shower head part 13 to a side of the gas line 100.

In step 5, the valves 204a, 204b, and 204c are closed so that the supply of the first process gas to the process space 11A is stopped. The first process gas, not being adsorbed on the processed substrate and remaining in the process space 11A, is exhausted from the exhaust port 15 of the process vessel 11. In this case, the process space 11A may be purged by opening the valves 201a, 201b, 102a, and 102b and introducing Ar as purge gas from the gas lines 200 and 100. In this case, the remaining first process gas is immediately exhausted from the process space. After the purge for a designated time is completed, the valves 201a, 201b, 102a, and 102b are closed.

In step 6, the valves 101a and 101b are opened and the flow amount is controlled by the mass flow rate controller 101A so that $H_2$ gas is introduced from the gas line 100 into the process space 11A. Furthermore, the RF power is applied to the shower head part 13 by the radio frequency power source 17 so that plasma-exciting is done in the process space 11A. In this case, $H_2$ in the process space is dissociated so as to become $H^+/H^*$ (hydrogen ion and hydrogen radical) and react with the first process gas $(Ta(NC(CH_3)_2C_2H_5)(N(CH_3)_2)_3)$ adsorbed on the processed substrate. In this case, as described above, a property of the formed thin film such as composition can be controlled depending on the magnitude of the RF power applied to the shower head part 13.

In this case, for the purpose of making the flow amount of the second process gas stable before the plasma is excited or the purpose of increasing the pressure in the process space, the second process gas may be supplied for a designated time.

In this step, the flow amount may be controlled by the mass flow rate controller 201A by opening the valves 201a and 201b and Ar as reverse flow prevention gas may be supplied from the gas line 200 to the process space 11A, so that the second process gas may be prevented from reverse-flowing from the shower head part 13 to the side of the gas line 200.

Next, in step 7, the valves 101a and 101b are closed so that the supply of the second process gas to the process space 11A is stopped. The second process gas, not being reacted with the first process gas on the processed substrate and remaining in the process space 11A, is exhausted from the exhaust port 15 of the process vessel 11. In this case, the process space 11A may be purged by opening the valves 201a, 201b, 102a, and 102b and introducing Ar as purge gas from the gas lines 200 and 100. In this case, the remaining second process gas is immediately exhausted from the process space. After the purge for a designated time is completed, the valves 201a, 201b, 102a, and 102b are closed.

Next, in step 8, in order to form the thin film having a necessary film thickness on the processed substrate, the deposition process goes back to the step 4 again. The steps 4 through 7 are repeated until the desirable film thickness is obtained. After the steps 4 through 7 are repeated a necessary number of times, the process goes to next step 9.

In a case where the steps 4 through 7 are repeated, after the steps 4 through 7 are repeated an optional number of times, the RF power applied in step 6 is changed and then the steps 4 through 7 may be repeated another necessary number of time. Alternatively, in a case where the steps 4 through 7 are repeated, the RF power applied in step 6 is gradually increased or decreased, so that the property of the formed film may be changed in the direction of the film thickness.

In step 9, the processed substrate W is separated from the substrate holding table 12. In step 10, the processed substrate W is carried out from the process vessel 11.

In this embodiment, the first and second process gases can be supplied into the process vessel by not only the above-mentioned way but also various ways. Furthermore, not only the first or second process gas but also various gases, if necessary, can be supplied into the process vessel.

For example, $H_2$ gas as an example of the second process gas may be continuously supplied into the process vessel from step 4 through step 7. The portion of the $H_2$ gas contributing to the reaction for the deposition in steps other the step 6 for plasma-exciting may be small. Hence, the $H_2$ gas may not substantially contribute to the reaction on the processed substrate. Therefore, in a case where the $H_2$ gas is continuously supplied into the process vessel from step 4 through step 7, the pressure inside of the process vessel is made stable. Since the pressure inside of the process vessel is substantially held constant for the step 4 through step 7, the deposition process is made stable. In this case, the flow amount of the first process gas is smaller than the flow amount of the second process gas. Therefore, the supply of the first process gas does not give influence to the change of the pressure inside of the process vessel.

In a case where the plasma is excited in step 6, for example, the flow amount of the second process gas may be increased so that the pressure inside of the process vessel is increased and therefore the ignition for the plasma can be done easily. Similarly, the Ar gas may be supplied into the process vessel in order to make the plasma ignition easy. It is suitable that the increased pressure be immediately decreased to the original pressure or the supply of the Ar gas be stopped after the plasma ignition.

In step 6, Ar may be supplied into the process vessel so that an ion for cutting the bonding of the material adsorbed on the processed substrate, for example, is generated for promoting the reaction in the deposition process.

Thus, by the deposition process of this embodiment, the film including metal such as Ta(C)N film, can be formed on the processed substrate. Ta(C)N film includes at least Ta, C and N as ingredients for the film. There are no limitations of bonding state and content of the ingredients.

The film, formed by this embodiment and including the metal, has little impurity, high quality, and a good coverage property for being deposited on a minute pattern. Hence, it is suitable to use the film for a Cu wiring diffusion barrier film or adhesion film for a high performance semiconductor device having a minute wiring pattern.

The film deposited by the deposition method in this embodiment is not limited to a film including Ta such as Ta(C)N film. For example, it is possible to form a film including a metal such as Ti or W and to obtain the same effect as the effect obtained for the film including Ta.

According to the deposition method of this embodiment, for example, it is possible to form a Ta(C)N film, a Ti(C)N film, and a W(C)N film. In this case, the Ti(C)N film includes at least Ti, C, and N as ingredients for the film. The W(C)N film includes at least W, C, and N as ingredients for the film. There are no limitations of bonding state and content of the ingredients.

If the amide compound gas is used as the first process gas, the metal, C, and N may be included in the film. The composition of the formed thin film can be changed by changing the RF power by which the second process gas, namely reduction gas, is dissociated.

For example, amide compound gas is gas selected from a group consisting of $Ta(NC(CH_3)_2C_2H_5)(N(CH_3)_2)_3$, $Ta[N(C_2H_5CH_3)]_5$, $Ta[N(CH_3)_2]_5$, $Ta[N(C_2H_5)_2]_5$, $Ta(NC(CH_3)_3)(N(C_2H_5)_2)_3$, $Ta(NC(CH_3)_3)(N(CH_3)_2)_3$, $Ta(NC_2H_5)(N(C_2H_5)_2)_3$, $Ta(N(C_2H_5)_2)(N(C_2H_5)_2)_3$, $Ti[N(C_2H_5CH_3)]_4$, $Ti[N(CH_3)_2]_4$, and $Ti[N(C_2H_5)_2]_4$.

The first process gas may be, for example, a solid, liquid, or gas at normal temperature. In a case where the first process gas is liquid or gas at normal temperature, the solid or liquid may be vaporized by heating if necessary or by using a vaporizer or sublimated by heating so as to be used as gas. Alternatively, a solid material is dissolved in a solvent so as to be changed to liquid and then the liquid is vaporized so that the first process gas is obtained.

For example, although $Ta(NC(CH_3)_2C_2H_5)(N(CH_3)_2)_3$ discussed above as an example of the material 206A is solid at normal temperature, Ta $(NC(CH_3)_2C_2H_5)(N(CH_3)_2)_3$ can be handled as liquid at normal temperature by dissolving it in a solvent of Hexane liquid. The obtained liquid is vaporized by the vaporizer 203 shown in FIG. 1 so that the first process gas can be obtained. Since a heater (not shown) is provided for the material vessel 206 of the deposition apparatus 10 shown in FIG. 1, a solid material can be changed to liquid by heating.

The film formed by the deposition method of this embodiment has high film quality and good uniformity of the film quality and the film thickness. In addition, the film has good step coverage of a minute pattern. The film is not limited to the Cu diffusion barrier film but may be one of various thin films forming the semiconductor device.

Thus, according to the above-discussed present invention, it is possible to provide a deposition method for forming a thin film by mutually supplying a first gas including a metal, nitrogen, and carbon and a second gas reducing the first gas so that the thin film is formed, whereby content of at least one of the metal, nitrogen, and carbon in the thin film can be controlled.

The present invention is not limited to these embodiments, but variations and modifications may be made without departing from the scope of the present invention.

This patent application is based on Japanese Priority Patent Application No. 2004-226953 filed on Aug. 3, 2004, the entire contents of which are hereby incorporated by reference.

What is claimed is:

1. A deposition method for forming a film on a processed substrate, where the film comprises a first thin film on the processed substrate and a second thin film on the first thin film, by supplying a first gas comprising an amide compound including a metal and a second gas reducing the first gas into a process vessel where a substrate holding table for holding the processed substrate is provided inside thereof, the deposition method comprising a first step comprising supplying the first process gas into the process vessel;

a second step comprising supplying the second process gas into the process vessel and applying a first radio frequency power to a plasma-exciting part provided in the process vessel so that the second process gas is plasma excited;

a third step comprising supplying the second process gas into the process vessel and applying a second radio frequency power to the plasma-exciting part provided in the process vessel so that the second process gas is plasma-excited;

forming the first thin film by repeating the first step and the second step; and forming the second thin film on the first thin film by repeating the first step and the third step, wherein the second radio frequency power is lower than the first radio frequency power; and a nitrogen content of the second thin film is higher than a nitrogen content of the first thin film.

2. The deposition method as claimed in claim 1, wherein the metal is at least one of Ta, Ti and W.

3. The deposition method as claimed in claim 1, wherein the forming the first thin film comprises sequentially repeating the first step and the second step plural times; and the forming the second thin film comprises sequentially repeating the first step and the third step plural times.

4. The deposition method as claimed in claim 1, further comprising purging an inside of the process vessel after each of the first step, the second step and the third step is implemented.

5. The deposition method as claimed in claim 1, wherein the amide compound is $Ta(NC(CH_3)_2C_2H_5)(N(CH_3)_2)_3$.

6. The deposition method as claimed in claim 1, wherein the first and second process gases are supplied to an inside of the process vessel via a shower head part provided in the process vessel.

7. The deposition method as claimed in claim 1, wherein the plasma-exciting part includes a shower head part, and each of the first radio frequency power and the second radio frequency power is applied to the shower head so that plasma-exciting is made.

8. The deposition method as claimed in claim 1, wherein the second process gas is $H_2$ gas.

9. The deposition method as claimed in claim 8, wherein the second process gas is continuously supplied to the process vessel from the forming the first thin film to the forming the second thin film.

10. The deposition method as claimed in claim 9, wherein a pressure in the process vessel is held so as to be made constant from the forming the first thin film to the forming the second thin film.

11. The deposition method as claimed in claim 8, further comprising increasing a pressure of an inside of the process vessel for starting the plasma-exciting in the second step.

12. The deposition method as claimed in claim 1, further comprising depositing a film comprising copper on the film, comprising the first thin film and the second thin film, on the processed substrate.

13. The deposition method as claimed in claim 12, wherein the film, comprising the first thin film and the second thin film, is a copper diffusion barrier.

* * * * *

UNITED STATES PATENT AND TRADEMARK OFFICE
CERTIFICATE OF CORRECTION

| | | |
|---|---|---|
| PATENT NO. | : 7,491,430 B2 | Page 1 of 1 |
| APPLICATION NO. | : 11/180597 | |
| DATED | : February 17, 2009 | |
| INVENTOR(S) | : Ishizaka et al. | |

It is certified that error appears in the above-identified patent and that said Letters Patent is hereby corrected as shown below:

On the title page, the Terminal Disclaimer information has been omitted. Item (45) and the Notice information should read as follows:

-- (45) Date of Patent: * Feb. 17, 2009

(*) Notice:   Subject to any disclaimer, the term of this patent is extended or adjusted under 35 U.S.C. 154(b) by 609 days.

This patent is subject to a terminal disclaimer. --

Signed and Sealed this

Twentieth Day of April, 2010

David J. Kappos
*Director of the United States Patent and Trademark Office*